(12) United States Patent
Jeng

(10) Patent No.: US 7,446,038 B2
(45) Date of Patent: Nov. 4, 2008

(54) INTERLAYER INTERCONNECT OF THREE-DIMENSIONAL MEMORY AND METHOD FOR MANUFACTURING THE SAME

(75) Inventor: Pei-Ren Jeng, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 221 days.

(21) Appl. No.: 11/423,619

(22) Filed: Jun. 12, 2006

(65) Prior Publication Data
US 2007/0178693 A1 Aug. 2, 2007

(30) Foreign Application Priority Data
Jan. 27, 2006 (TW) ............... 95103435 A

(51) Int. Cl.
*H01L 21/302* (2006.01)
(52) U.S. Cl. .............. 438/666; 438/588; 438/129; 257/773; 257/E21.627; 257/E21.641
(58) Field of Classification Search .......... 438/666, 438/588, 599, 598, 129; 257/E21.627, E21.641, 257/E21.66, E21.656, E21.575, 773, 758
See application file for complete search history.

(56) References Cited

U.S. PATENT DOCUMENTS 6,501,127 B2 * 12/2002 Mori .................... 257/321
6,984,861 B2 * 1/2006 Yamada et al. ........... 257/306
2005/0127519 A1 * 6/2005 Scheuerlein et al. ...... 257/773
2005/0133875 A1 * 6/2005 Zhang ................... 257/390

FOREIGN PATENT DOCUMENTS

JP 2004-362753 12/2004

* cited by examiner

Primary Examiner—Caridad M Everhart
(74) Attorney, Agent, or Firm—WPAT, P.C.; Anthony King

(57) ABSTRACT

An interlayer interconnect structure of a three-dimensional memory includes memory cell groups, each composed of a plurality of memory cells and connected to their respective selection transistors, because of special arrangement of lines and first plugs as well as line layouts. The line layouts involve disposing a plurality of lines on each of a plurality of horizontal levels, and selectively forming second plugs between adjoining lines disposed on upper and lower horizontal levels, such that the plugs selectively connect the adjoining upper and lower lines to each other. Since identical layout patterns are adopted in individual stacking states of stacking layers disposed in the three-dimensional memory, the upper lines and the lower lines of the stacking layers of the three-dimensional memory share the same layouts, leading to a reduction in the number of masks used, simpler process adjustment, and lower costs.

30 Claims, 8 Drawing Sheets

INTERLAYER INTERCONNECT OF THREE-DIMENSIONAL MEMORY AND METHOD FOR MANUFACTURING THE SAME

FIELD OF THE INVENTION

The present invention is related to semiconductor processes, and more particularly, to an interlayer interconnect structure of a three-dimensional memory device and a method for manufacturing the same.

BACKGROUND OF THE INVENTION

Owing to the wide use of electronic products and computer related products, there is increasingly great demand for semiconductor memory devices. Hence, one of the key topics for recent research and development of semiconductor memory process is about disposing and stacking multiple layers of memory cells on a substrate. The substrate of a three-dimensional memory is provided with layers of memory devices such that the memory devices are not necessarily formed on the substrate and disposed in a single layer but stacked on top of each other. Nevertheless, it is rather intricate and difficult to perform a three-dimensional memory process.

As regards the available technology, three-dimensional memory research is mostly about an array of memory cells in three dimensions rather than about interconnects between a stacked three-dimensional memory and a substrate. FIG. 1 (PRIOR ART) shows a three-dimensional memory proposed by Hitachi in 2004 (Japanese Patent No. JP2004-362753); disposed within a memory array area of the three-dimensional memory is a multilayer memory array composed of memory cells 112; with every memory cell layer within the memory array area of the three-dimensional memory having exactly the same memory pattern, difficulties in the memory array area process of a conventional three-dimensional memory are dissolved. However, in the situation where selection transistors 111 are connected to upper or lower electrodes on different stacking layers so as to perform addressing on memory cells located on different layers, upper or lower electrode lines on each stacking layer have to be extended to different extents so as to connect with individual selection transistors. In so doing, every upper or lower line and contact window has to use different masks in the course of three-dimensional stacking, which necessitates complicated mask design, such as optical proximity correction (OPC), phase-shift masks, and dummy patterning. And further, subsequent process adjustment, such as line-end shortening, is cost-inefficient.

Accordingly, a semiconductor back-end manufacturing process is greatly in need of an improved structure which leads to a reduction in the number of masks used and steps performed and a method for manufacturing the same, with a view to cutting costs and simplifying process adjustment.

SUMMARY OF THE INVENTION

In order to solve the aforesaid problems of the prior art, a primary objective of the present invention is to provide an interlayer interconnect structure of a three-dimensional memory and a method for manufacturing the same with a view to performing addressing on memory cells disposed on different layers by connection of selection transistors to upper or lower electrode lines disposed on different stacking layers and sparing the upper or lower lines on each layer a different degrees of extension which is otherwise required for connection with selection transistors and accountable for the use of various masks in every upper or lower line and contact window on every layer as well as subsequent process adjustment.

Another objective of the present invention is to provide an interlayer interconnect structure of a three-dimensional memory and a method for manufacturing the same, such that the stacking of a three-dimensional memory is characterized by a reduced number of masks used between the layers and simplified process adjustment, thus cutting the manufacturing cost.

Another objective of the present invention is to provide an interlayer interconnect structure of a three-dimensional memory and a method for manufacturing the same, wherein regularity of the interlayer interconnect structure enables the selective use of identical layouts during an stacking operation, resulting in a simplified interconnect structure of the three-dimensional memory.

To achieve the above and other objectives, the present invention provides an interlayer interconnect structure of a three-dimensional memory and a method for manufacturing the same. The method comprises the steps of: defining a memory array area, a first peripheral interconnect area disposed along a first direction of the memory array area, and a second peripheral interconnect area disposed along a second direction of the memory array area; forming a plurality of selection transistors, interlayer dielectric layers and contact windows within the first peripheral interconnect area and the second peripheral interconnect area respectively such that the positions where the above-mentioned are formed are identical to that where the above-mentioned are formed in accordance with discrete line layouts of the first and second peripheral interconnect areas of subsequent process; stacking multiple layers of memory cells within the memory array area, such that the memory cells disposed on the same layer and aligned along the first direction, or the memory cells disposed on the same layer and aligned along the second direction, are collectively defined as a memory cell group; disposing lines and plugs within the first peripheral interconnect area and the second peripheral interconnect area, connecting two required lines by each of the plugs, stacking the memory cells upward in accordance with the same layouts, and eventually connecting the selection transistors to the memory cells disposed on different layers of the three-dimensional memory array and addressing the memory cells by the selection transistors.

The method for manufacturing an interlayer interconnect structure of a three-dimensional memory according to the present invention involves using the designs of plugs and lines to achieve the regularity of the layouts of the upper or lower lines disposed within the first peripheral interconnect area and the second peripheral interconnect area, collectively defining the regular, upward-stacking line layouts as a stacking state, and repeating the upward stacking in the stacking state, such that not only do all the line layouts have the same pattern under the stacking state, but the upper and lower lines are connected by plugs so as to reduce the number of masks used and simplify the subsequent process adjustment.

The present invention provides an interlayer interconnect structure of a three-dimensional memory according to the present invention. The interlayer interconnect structure comprises the selection transistors, the interlayer dielectric layers, the contact windows, the plugs, and the multilayer memory array. The interlayer dielectric layers and the contact windows connect the selection transistors to the lines. The plugs function as the interconnects between the lines. The multilayer memory array comprises memory cell groups formed by a plurality of memory cells each. The lines, plugs and contact windows connect the memory cells to the selection transistors.

BRIEF DESCRIPTION OF THE DRAWINGS

An interlayer interconnect structure of a three-dimensional memory and a method for manufacturing the same proposed in accordance with the present invention can be more fully comprehended by reading the detailed description of the preferred embodiments enumerated below, with reference made to the accompanying drawings, wherein.

DETAILED DESCRIPTION OF THE PREFERRED EMBODIMENTS

An interlayer interconnect structure of a three-dimensional memory and a method for manufacturing the same proposed according to the present invention are elucidated in the following preferred embodiments and relevant drawings.

FIGS. 2 to 8 illustrate a method for manufacturing an interlayer interconnect structure of a three-dimensional memory according to the present invention.

In the first place, a memory array area, a first peripheral interconnect area disposed along a first direction of the memory array area, and a second peripheral interconnect area disposed along a second direction of the memory array area are defined on a silicon substrate of a semiconductor chip provided, with a view to giving a definite description of the present invention. In the following drawings, direction x denotes the first direction, and y denotes the second direction, for ease of notation. This embodiment makes an assumption that the first direction and the second direction are perpendicular to each other.

Figure 1:
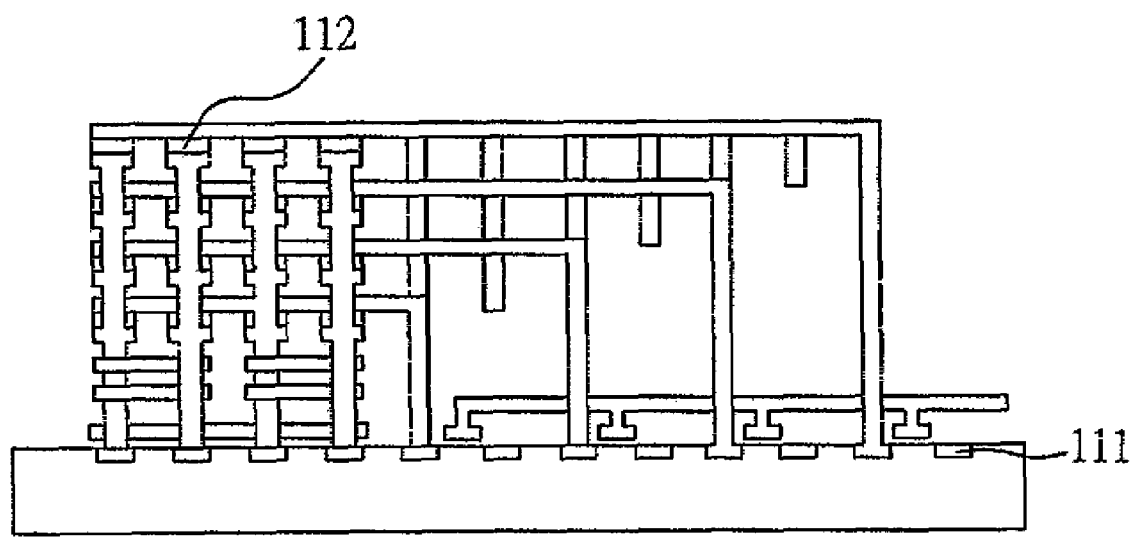
FIG. 1 (PRIOR ART) is a schematic view of conventional interconnects of a three-dimensional memory according to the prior art.
Figure 2A:
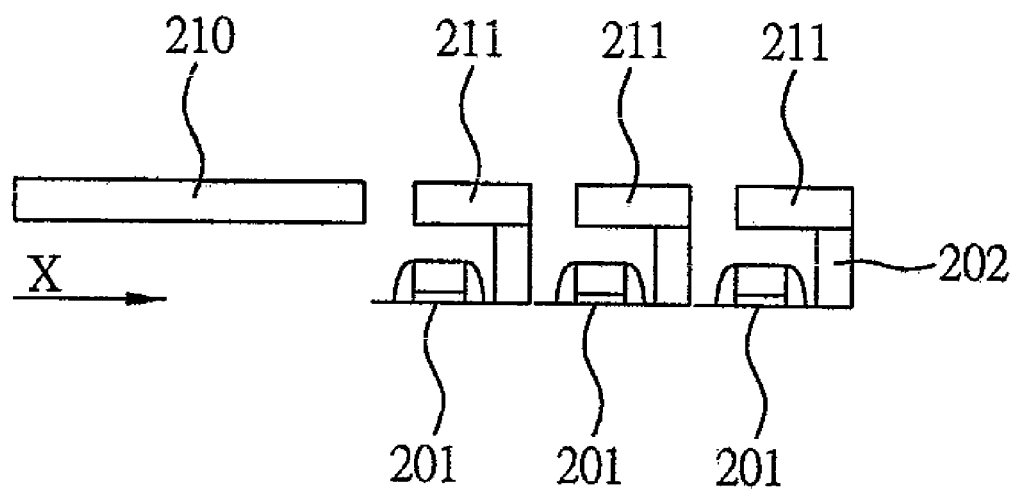
FIG. 2A is a schematic view of a first peripheral interconnect area and a memory array area, both disposed at a first height and along a first direction, according to the present invention.
Figure 2B:
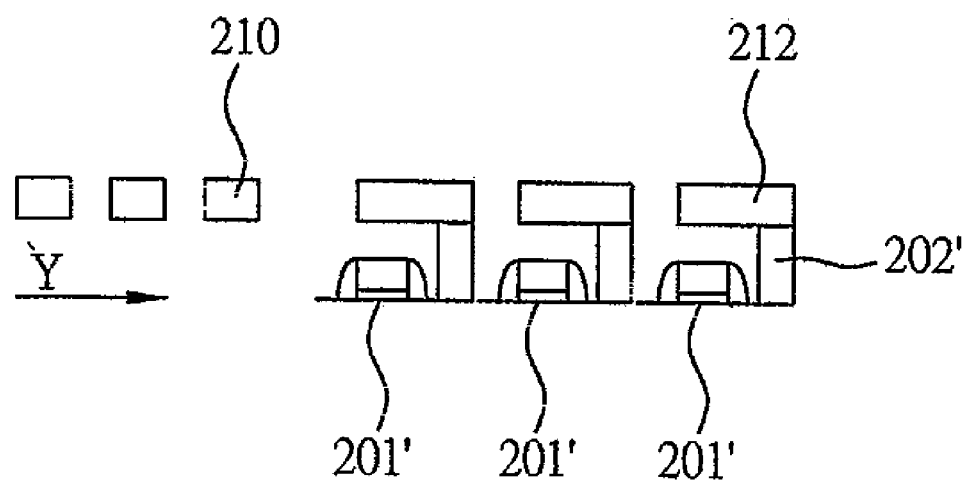
FIG. 2B is a schematic view of a second peripheral interconnect area and a memory array area, both disposed at a first height and along a second direction, according to the present invention.

Referring to FIGS. 2A and 2B, a plurality of selection transistors 201 and 201', contact windows 202 and 202', and interlayer dielectric layers (not shown) are formed within the first peripheral interconnect area and the second peripheral interconnect area respectively; the positions where the above-mentioned are formed are identical to the positions of discrete line layouts disposed within the first and second peripheral interconnect areas and at a first height as described below. As shown in FIG. 2A, direction x denotes the first direction described according to the present invention, and the related vertical axis represents the direction in which stacking takes place. As shown in FIG. 2B, direction y denotes the second direction described according to the present invention, and the related vertical axis represents the direction in which stacking takes place. The contact windows 202 is a rectified (a Schottky contact) or an ohmic contact, and is made of adaptive material of low contact resistance and high thermal stability; the contact windows 202 was disclosed by the prior art, thus it is not described in detail herein.

Figure 3:
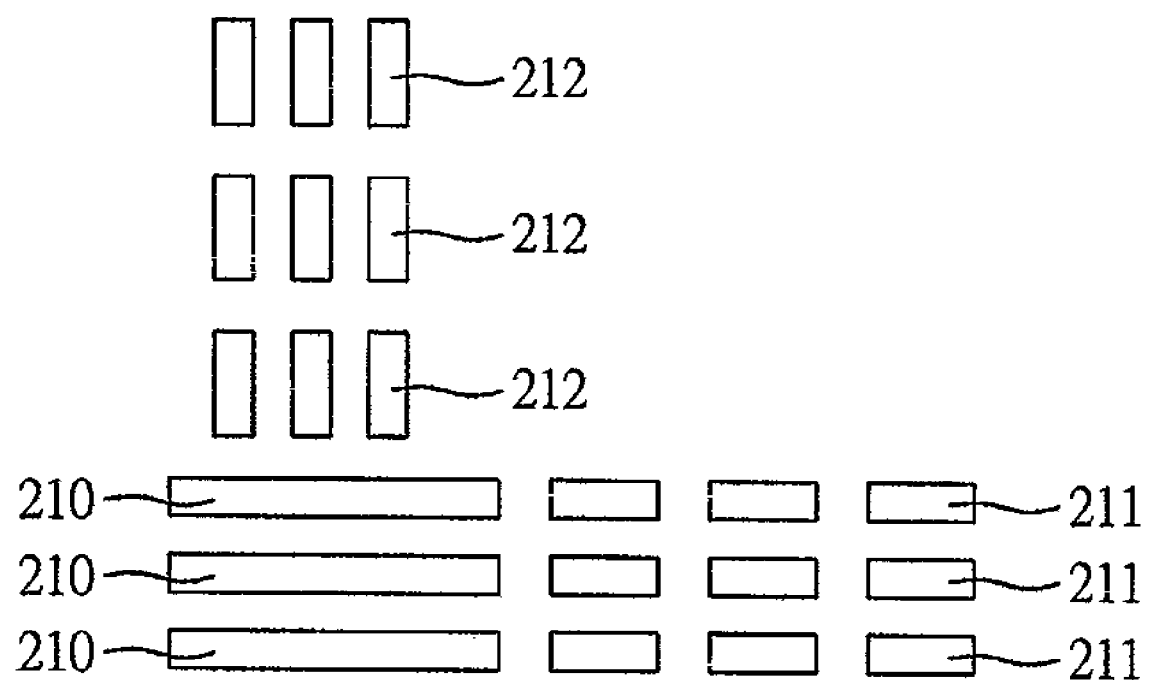
FIG. 3 is a top plan view of a second and first peripheral interconnect areas and a memory array area, all disposed at a first height, according to the present invention.

Referring to FIG. 3, a plurality of line 210 patterns disposed in parallel to the first direction are formed within the memory array area, with the lines properly spaced apart, whereas a plurality of discrete line 211 patterns are formed within the first peripheral interconnect area and in the direction of the extension to the plurality of lines 210 which are parallel and located within the memory array area. Referring to FIG. 3 again, the discrete line 211 patterns of the first peripheral interconnect area are disposed in two dimensions. Discrete line patterns, which are formed in the direction of the extension to any of the plurality of parallel lines 210 disposed within the memory array area, are collectively defined as a discrete line group. In other words, the plurality of discrete lines aligned, disposed within the first peripheral interconnect area, and disposed along the first direction, are collectively defined as a discrete line group. Each discrete line group comprises a plurality of discrete lines, which equal the layers to be stacked in number. As shown in FIG. 2A, the contact windows 202 connect the plurality of discrete lines 211 to the selection transistors 201.

Referring to FIG. 2B, a plurality of discrete line 212 patterns are formed within the second peripheral interconnect area and in a direction (that is, the second direction) perpendicular to the direction of the extension to the plurality of parallel lines 210. Referring to FIG. 3 again, the discrete line 212 patterns of the second peripheral interconnect area are disposed in two dimensions. The plurality of discrete lines 212 aligned in the second direction is collectively defined as a discrete line group. Each discrete line group comprises a plurality of discrete lines, which equal the layers to be stacked in quantity. The discrete line groups are properly spaced apart and are disposed in parallel. The contact windows 202' connect the plurality of discrete lines 212 to the selection transistors 201'. At this point, the height the upwardly stacked lines reach is defined as a first height.

FIG. 3 is a reader-friendly schematic view of the line layouts achieved at the first height according to the present invention. In this embodiment, as shown in FIG. 3, to simplify the explanation of the present invention, it is assumed that the number of layers to be stacked is three. It should be noted that layouts of the lines 210, 211 and 212 corresponding to the number of layers stacked are not governed by any specific limit but are subject to change when necessary.

Figure 4A:
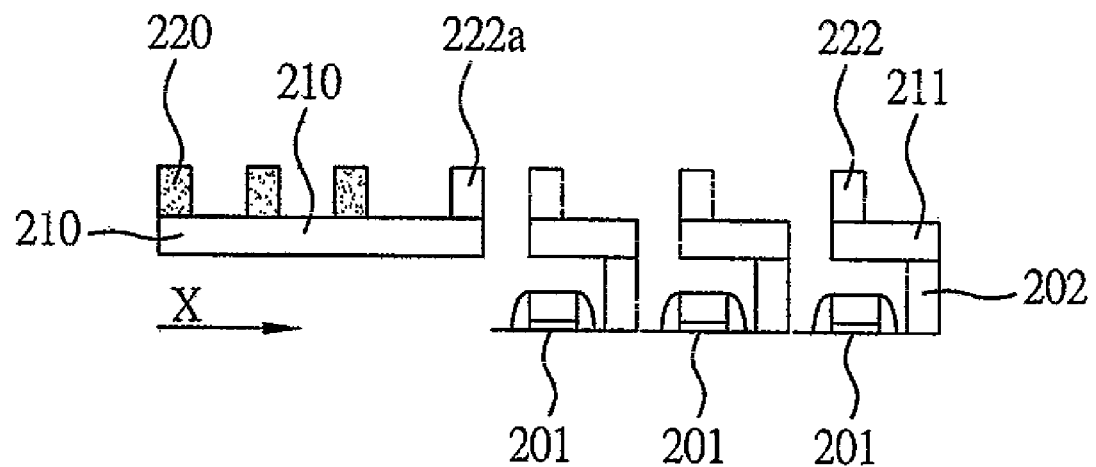
FIG. 4A is a schematic view of a first peripheral interconnect area and a memory array area, both disposed at a second height and along a first direction, according to the present invention.
Figure 4B:
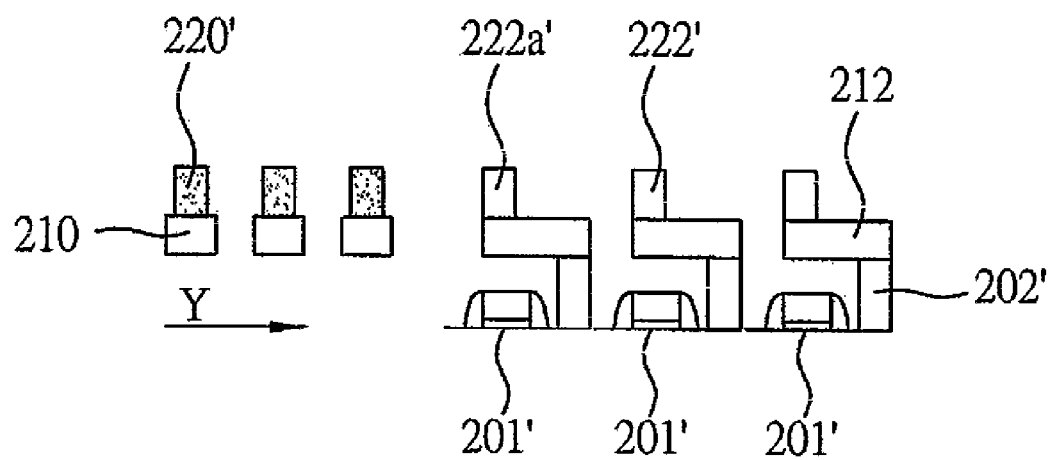
FIG. 4B is a schematic view of a second peripheral interconnect area and a memory array area, both disposed at a second height and along a second direction, according to the present invention.

Referring to FIGS. 4A and 4B, a plurality of memory cells 220 are formed on the parallel lines disposed at the first height within the memory array area, such that the memory cells formed at the first height are disposed in two dimensions within the memory array area, collectively defining the memory cells aligned along the first direction as a memory cell group and the memory cells aligned along the second direction as another memory cell group. The memory cells 220 shown in FIG. 4A belong to a memory cell group aligned along the first direction. The memory cells 220' shown in FIG. 4B belong to a memory cell group aligned along the second direction. The memory cells are one selected from the group consisting of magnetic random access memory (MRAM), phase change memory (PCM), resistance random access memory (RRAM), programmable metallization cell memory (PMCm), and programmable read-only memory (PROM).

Referring to FIG. 4A, the ends (near the first peripheral interconnect area) of the parallel lines disposed within the memory array area are formed with plugs 222a. The discrete lines disposed within the first and second peripheral interconnect areas, specifically portions of the discrete lines facing the memory array area, are formed with plugs 222 and 222', as shown in FIGS. 4A and 4B respectively. The height of the plugs formed, as shown in FIGS. 4A and 4B, is defined as a second height.

In order to present the characteristics of the present invention clearly, conventional metal interconnect skills are not described in detail in the drawings. For instance, the drawings omit any insulating layer interposed between a line and a plug, and any interlayer dielectric layer as well. As regards the prior art, the plug may be a tungsten plug fabricated by chemical vapor deposition (CVD); not only a glue layer composed of titanium/titanium nitride (Ti/TiN) layer or a titanium tungsten (TiW) layer is deposited so as to improve the crystalline structure of aluminum, prevent electromigration and enhance cohesion, but a barrier layer conducive to the prevention of spiking is deposited, if necessary; interconnects are typically made of metal, such as gold, aluminum, copper, silver, chromium and nickel, of which aluminum is most widely in use; electromigration may also be lessened by the use of copper-aluminum alloy, for example, incorporating a tiny amount of copper (0.5% to 4% approximately) into aluminum, and then layouting is achieved by the process of masking, photolithography and etching; a dielectric layer, the insulating material interposed between two metal layers, can be made of silicon dioxide ($SiO_2$) and other appropriate materials. The above-mentioned belong to the prior art and thus they are skipped over and omitted in the drawings.

Figure 5A:
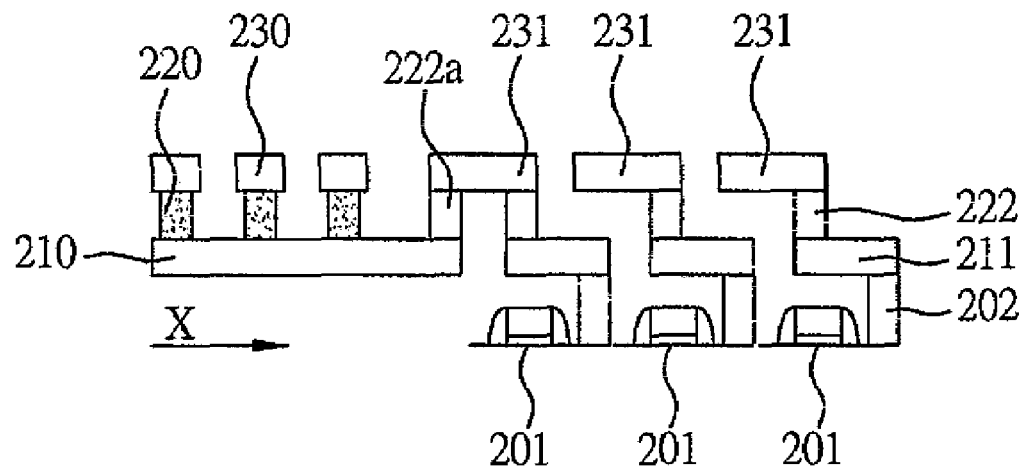
FIG. 5A is a schematic view of a first peripheral interconnect area and a memory array area, both disposed at a third height and along a first direction, according to the present invention.
Figure 5B:
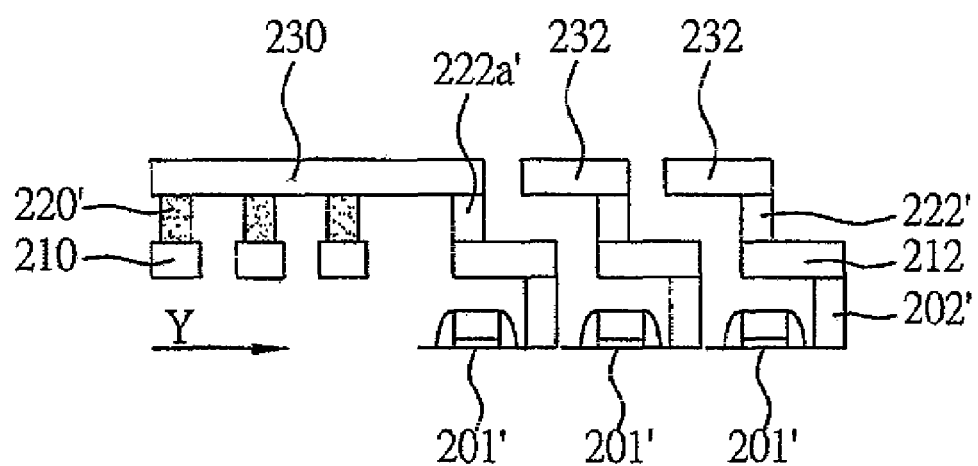
FIG. 5B is a schematic view of a second peripheral interconnect area and a memory array area, both disposed at a third height and along a second direction, according to the present invention.

Referring to FIGS. 5A and 5B, lines disposed along the second direction are formed at the second height within the memory array area, and then the height at which the parallel lines are formed is defined as a third height, wherein the projected images of the parallel lines 230 disposed along the second direction and at the third height intersect, at the second height, the projected images of the parallel lines 210 disposed along the first direction and at the first height, and it is the very point of intersection where memory cells 220 or 220' located at the second height within the memory array area are formed.

A plurality of discrete line 231 patterns are formed at the third height within the first peripheral interconnect area. The number of the plurality of discrete line 231 patterns formed equals the required number of stacking layers. The plurality of discrete line 231 patterns are formed at positions located at the third height and separated, by a proper distance of horizontal translation toward the memory array area, from the locations (disposed at the third height) at which images of the respective discrete lines 211 disposed at the first height within the first peripheral interconnect area are projected. Among the plurality of discrete line 231 patterns formed at the third height, the discrete lines closest to the memory array area are connected to the lines disposed at the first height within the memory array area by the plugs 222a formed at the second height within the memory array area. In addition, all the plurality of discrete line 231 patterns formed are connected to the discrete lines 211 patterns formed at the first height within the first peripheral interconnect area by the plugs 222 formed at the second height, as shown in FIG. 5A.

Figure 6:
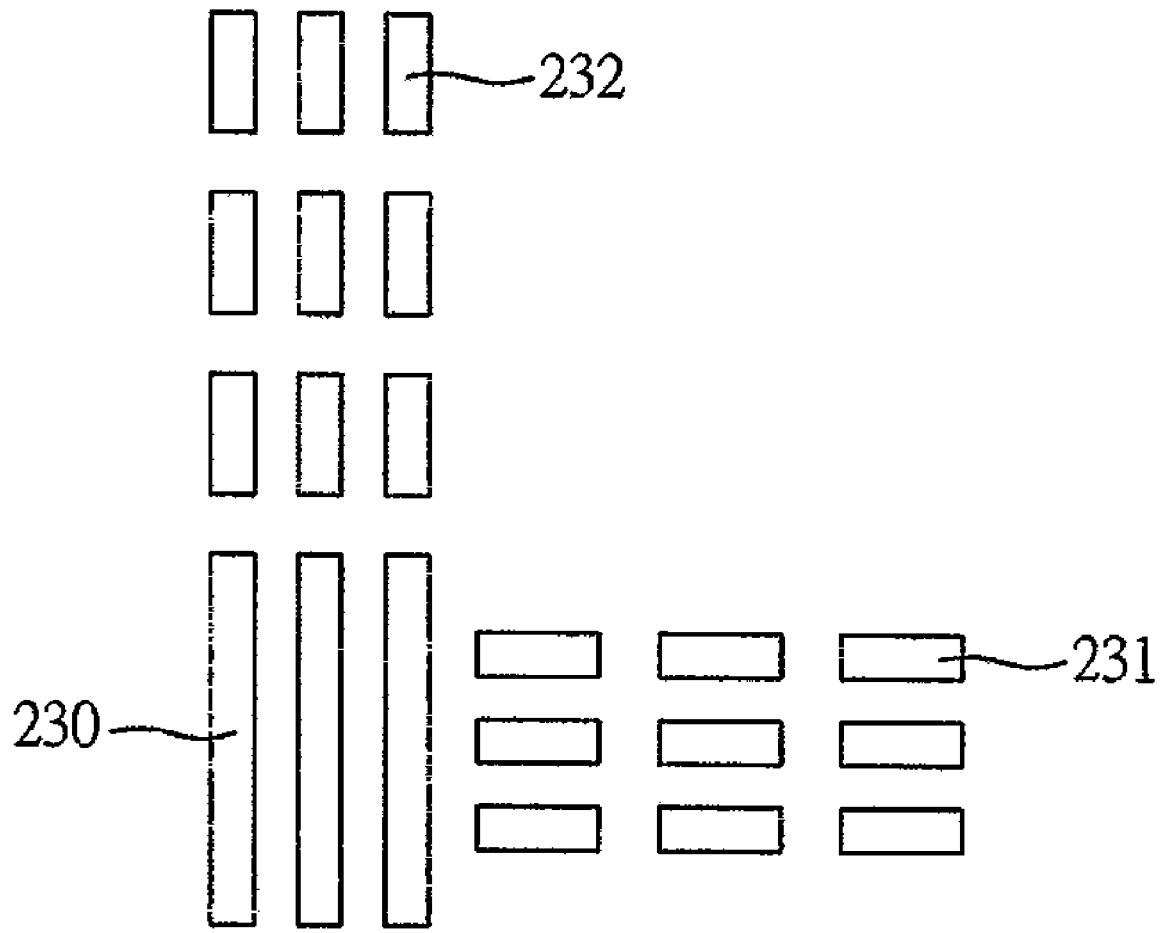
FIG. 6 is a schematic view of a second and first peripheral interconnect areas and a memory array area, all disposed at a third height, according to the present invention.

Referring to FIG. 5B, a plurality of discrete line 232 patterns are formed at the third height within the second peripheral interconnect area, and the number of the plurality of discrete line 232 patterns formed is less than the required number of stacking layers by one. The plurality of discrete line 232 patterns are formed at positions located at the third height and separated, by a proper distance of horizontal translation array from the memory array area, from the locations (disposed at the third height) at which images of the respective discrete lines 212 disposed at the first height within the second peripheral interconnect area are projected. In addition, the plurality of discrete line 232 patterns formed are connected to the discrete lines 212 patterns formed at the first height within the second peripheral interconnect area by the plugs 222 formed at the second height. On the other hand, ends of the parallel lines 230 disposed along the second direction and at the third height within the memory array area are connected to discrete lines disposed at the first height within the second peripheral interconnect area and closest to the memory array area by the plugs 222a' disposed at the second height within the second peripheral interconnect area and closest to the memory array area, as shown in FIG. 5B. FIG. 6 shows the line layouts disposed at the third height.

Figure 7A:
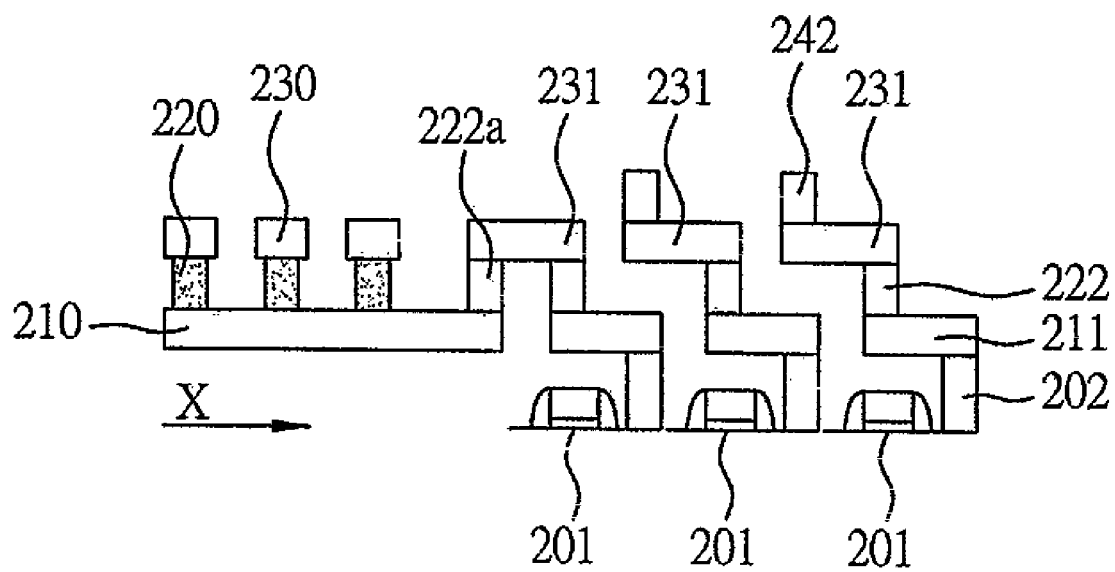
FIG. 7A is a schematic view of a first peripheral interconnect area and a memory array area, both disposed at a fourth height and along a first direction, according to the present invention.
Figure 7B:
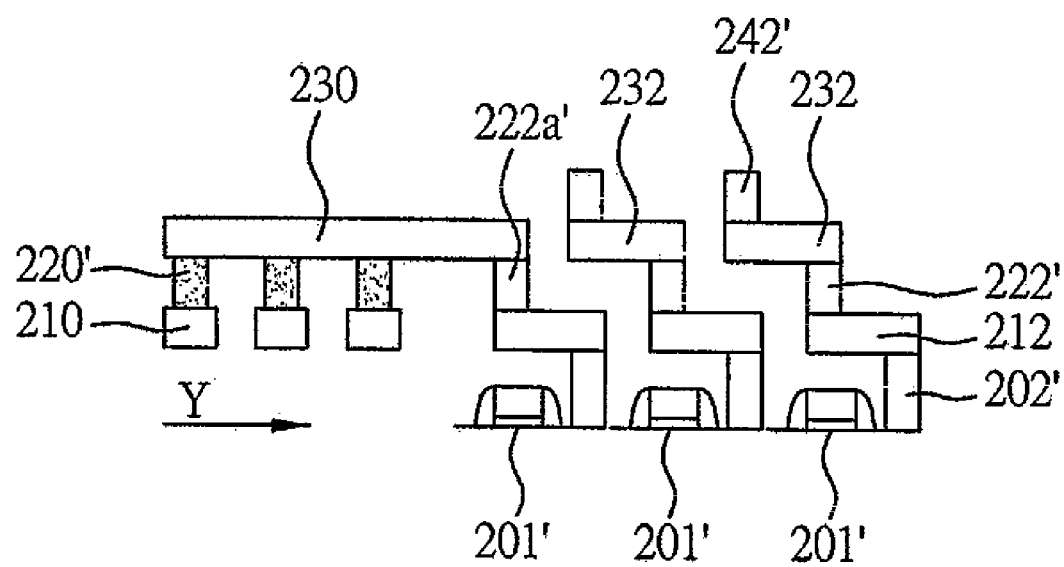
FIG. 7B is a schematic view of a second peripheral interconnect area and a memory array area, both disposed at a fourth height and along a second direction, according to the present invention.

Referring to FIGS. 7A and 7B, plugs 242 and 242' are formed on the discrete lines 231 and 232 disposed at the third height within the first and second peripheral interconnect areas, specifically at portions of the discrete lines 231 and 232 facing the memory array area. The height at which the plugs 242 and 242' are formed is defined as a fourth height. In order to prevent any upwardly stacked memory cells from abutting against the memory cells 220 disposed at the second height, no plug may be formed on the discrete lines disposed at the third height within the first peripheral interconnect area and closest to the memory array area, as shown in FIG. 7A. FIG. 7B is a lateral schematic view of a single discrete line group disposed within the second peripheral interconnect area. The line layouts disposed at height ranging from the first height to the fourth height are collectively defined as a stacking state. The stacking state of the first peripheral interconnect area is referred to as stacking state a, whereas that of the second peripheral interconnect area is referred to as stacking state a'.

Figure 8A:
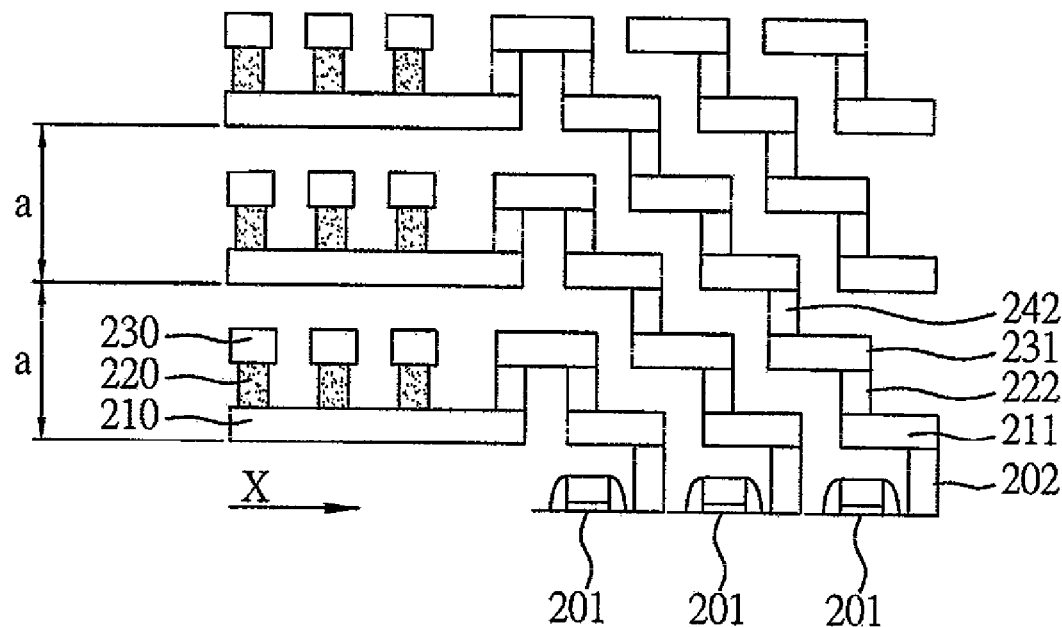
FIG. 8A is a schematic view of a first peripheral interconnect area and a memory array area of a three-dimensional memory structure, both disposed at a first direction, according to the present invention.
Figure 8B:
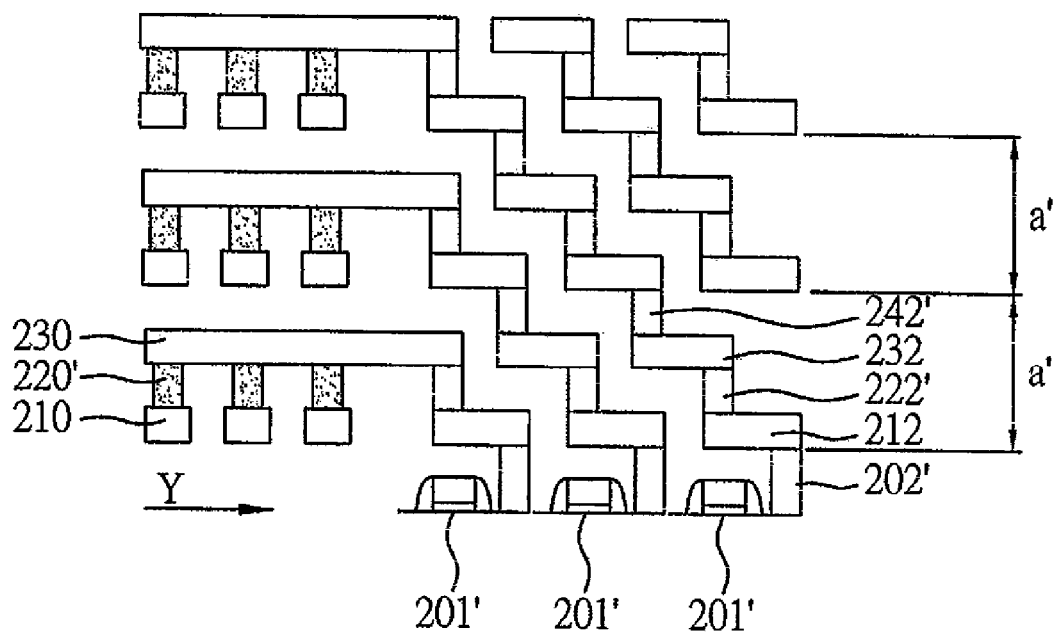
FIG. 8B is a schematic view of a second peripheral interconnect area and a memory array area of a three-dimensional memory structure, both disposed at a second direction, according to the present invention.

Referring to FIGS. 8A and 8B, the stacking operation of a three-dimensional memory of the present invention is performed and finalized, by adopting a combination of masks fully identical to the ones used at the first to fourth heights and repeating the steps related to the first to fourth heights several times. FIG. 8A is a schematic view of the first peripheral interconnect area and the first direction of the memory array area. FIG. 8B is a schematic view of the second peripheral interconnect area and the second direction of the memory array area. As regards the upper lines and the lower lines of in each stacking state a shown in FIG. 8A and each stacking state a' shown in FIG. 8B, the same layout patterns are adopted, and the same plugs function as interconnects, to perform upward stacking repeatedly.

Individual memory cell groups within the memory array area are connected to the selection transistors by the lines, the plugs and the contact windows. The lines can be connected to or separated from each other because of the special arrangement of the lines and the plugs. Hence, persons skilled in the art may design the arrangement of the lines and the plugs in such a way to meet the needs.

With memory cells being stacked in the aforesaid manner, not only do all the stacking states use the same layout pattern (changes may be made in certain stacking states so as to meet design requirements, if necessary), but the selection transistors are connected to the memory cells located on different stacking layers so as to perform addressing on the memory cells. In this embodiment, the lines and the plugs disposed within the peripheral interconnect areas connect the selection transistors are connected to the upper or the lower electrodes disposed on the stacking layers within the memory array area; in this regard, each interconnect is defined as a selection route to make explanation simple. As shown in FIGS. 8A and 8B, all the selection routes of this embodiment are ladder-like interconnects, and the selection routes are separated from each other, but none of the selection routes intersects or connects to another, because of the special arrangement of the discrete lines and the plugs in accordance with the method for manufacturing the interlayer interconnect structure of the three-dimensional memory of the present invention. The above-mentioned can be put in this way: as shown in FIG. 8A, a selection transistor disposed within the first peripheral interconnect area can be connected, via a selection route, to the lower line of each of the memory cells (aligned along the first direction) of each of the memory cell groups dispose within the memory array area; as shown in FIG. 8B, a selection transistor disposed within the second peripheral interconnect area can be connected, via a selection route, to the upper line of each of the memory cells (aligned along the second direction) of each of the memory cell groups dispose within the memory array area. The selection transistors of the first peripheral interconnect area and the selection transistors of the second peripheral interconnect area are connected, via their respective selection routes, to the upper lines and the lower lines of the stacking layers disposed within the memory array area, so as to perform addressing on the memory cells disposed within the memory array area.

The preferred embodiments described above only serve the purpose of explaining the principle and effects of the present invention, and are not to be used to limit the scope of the present invention. Basing on the purpose and the scope of the present invention, the present invention encompasses various modifications and similar arrangements, and its scope should be covered by the claims listed in the following pages.

What is claimed is:

1. A method for manufacturing an interlayer interconnect structure of a three-dimensional memory, the method comprising the steps of:

providing a substrate comprising a memory array area, a first peripheral interconnect area in a first-direction extension to the memory array area, and a second peripheral interconnect area in a second-direction extension to the memory array area;

forming lower electrode lines at a first height within the memory array area of the substrate;

forming discrete line patterns at the first height within the first and second peripheral interconnect areas of the substrate;

forming a plurality of memory cells at a second height within the memory array area;

forming first plugs at the second height within the first and second peripheral interconnect areas and at ends of the lines within the memory array area;

forming upper line patterns at a third height within the memory array area;

forming discrete line patterns at the third height within the first and second interconnect areas; and forming second plugs at a fourth height within the second peripheral interconnect area.

2. The method for manufacturing an interlayer interconnect structure of a three-dimensional memory of claim 1, wherein the first direction is perpendicular to the second direction.

3. The method for manufacturing an interlayer interconnect structure of a three-dimensional memory of claim 1, wherein the lower electrode lines formed at the first height within the memory array area of the substrate are disposed along the first direction and are parallel.

4. The method for manufacturing an interlayer interconnect structure of a three-dimensional memory of claim 1, wherein the plugs selectively connect the lower lines thereunder to the upper lines thereon.

5. The method for manufacturing an interlayer interconnect structure of a three-dimensional memory of claim 1, wherein the plurality of memory cells formed at the second height within the memory array area appear in the form of a two-dimensional array.

6. The method for manufacturing an interlayer interconnect structure of a three-dimensional memory of claim 1, wherein the upper line patterns formed at the third height within the memory array area are disposed along the second direction and are parallel.

7. The method for manufacturing an interlayer interconnect structure of a three-dimensional memory of claim 1, wherein line layouts disposed at height ranging from the first height to the fourth height are collectively defined as a stacking state.

8. The method for manufacturing an interlayer interconnect structure of a three-dimensional memory of claim 7 further comprising repeating steps relating to the first height through the fourth height.

9. The method for manufacturing an interlayer interconnect structure of a three-dimensional memory of claim 1, wherein the discrete line patterns formed at the first height within the first peripheral interconnect area of the substrate are formed in a first-direction extension to the line patterns at the first height within the memory array area, the discrete line patterns formed in the first-direction extension to any of the lines at the first height within the memory array area are collectively defined as a discrete line group.

10. The method for manufacturing an interlayer interconnect structure of a three-dimensional memory of claim 9, wherein the discrete line group comprises the discrete lines totaling to a number of the layers of the memory array to be stacked.

11. The method for manufacturing an interlayer interconnect structure of a three-dimensional memory of claim 10, wherein the discrete line groups are parallel.

12. The method for manufacturing an interlayer interconnect structure of a three-dimensional memory of claim 1, wherein the discrete line patterns formed at the first height within the second peripheral interconnect area of the substrate are not only perpendicular to the line patterns at the first height within the memory array area but also disposed along a second direction, the discrete line patterns perpendicular to the line patterns at the first height within the memory array area and disposed along the second direction are collectively defined as a discrete line group.

13. The method for manufacturing an interlayer interconnect structure of a three-dimensional memory of claim 12, wherein the discrete line group comprises the discrete lines totaling to a number of the layers of the memory array to be stacked.

14. The method for manufacturing an interlayer interconnect structure of a three-dimensional memory of claim 13, wherein the discrete line groups are parallel.

15. The method for manufacturing an interlayer interconnect structure of a three-dimensional memory of claim 1, wherein the discrete line patterns at the third height within the first peripheral interconnect are formed at positions located at the third height and separated, by a proper distance of horizontal translation toward the memory array area, from the locations at which images of the discrete lines formed at the first height within the first peripheral interconnect area are projected, and the discrete line patterns formed at the third height within the first interconnect area and along the first direction are collectively defined as a discrete line group.

16. The method for manufacturing an interlayer interconnect structure of a three-dimensional memory of claim 15, wherein the discrete line group comprises the discrete lines totaling to a number of the layers of the memory array to be stacked.

17. The method for manufacturing an interlayer interconnect structure of a three-dimensional memory of claim 1, wherein the discrete line patterns formed at the third height within the second peripheral interconnect area are formed in a second-direction extension to the line patterns at the third height within the memory array area, the discrete line patterns formed in the second-direction extension to any of the lines at the third height within the memory array area are collectively defined as a discrete line group.

18. The method for manufacturing an interlayer interconnect structure of a three-dimensional memory of claim 17, wherein the discrete line group comprises the discrete lines, and the number of the discrete lines is one less than that of the layers of the memory array to be stacked.

19. An interlayer interconnect structure of a three-dimensional memory comprising:
a substrate comprises a memory array area, a first peripheral interconnect area in a first-direction extension to the memory array area, and a second peripheral interconnect area in a second-direction extension to the memory array area;
a plurality of lower lines formed at a first height of the memory array area of the substrate;
a plurality of discrete lines formed at the first height within the second peripheral interconnect area;
a plurality of memory cells formed at a second height of the memory array area of the substrate;
a plurality of first plugs formed at the second height within the second peripheral interconnect area and at ends of the lines within the memory array area;
a plurality of upper lines formed at a third height of the memory array area; and
a plurality of second plugs formed at the fourth height within the second peripheral interconnect area.

20. The interlayer interconnect structure of a three-dimensional memory of claim 19, wherein the first direction is perpendicular to the second direction.

21. The interlayer interconnect structure of a three-dimensional memory of claim 19, wherein the lower lines are disposed along the first direction and are parallel.

22. The interlayer interconnect structure of a three-dimensional memory of claim 19, wherein the plurality of memory cells formed at the second height appear in the form of a two-dimensional array.

23. The interlayer interconnect structure of a three-dimensional memory of claim 19, wherein the upper electrode lines are disposed along the second direction and are parallel.

24. The interlayer interconnect structure of a three-dimensional memory of claim 19, wherein the memory cells formed at the second height are formed at positions where images of the lower line patterns and the upper line patterns are projected at the second height.

25. The interlayer interconnect structure of a three-dimensional memory of claim 19 further comprising selection transistors, interlayer dielectric layers and contact windows formed within the first and second peripheral interconnect areas of the substrate.

26. The interlayer interconnect structure of a three-dimensional memory of claim 19, wherein structure at height ranging from the first height to the fourth height is defined as a stacking state.

27. The interlayer interconnect structure of a three-dimensional memory of claim 26 further comprising structure formed by repeatedly stacking memory cell layers upward in the stacking state.

28. The interlayer interconnect structure of a three-dimensional memory of claim 25, wherein the selection transistors are connected to the upper electrodes or the lower electrodes of the stacking layers within the memory array area by the lines and the plugs within the first and second peripheral interconnect areas, and the interconnects are defined as selection routes.

29. The interlayer interconnect structure of a three-dimensional memory of claim 28, wherein the selection routes are not allowed to intersect each other.

30. The interlayer interconnect structure of a three-dimensional memory of claim 29, wherein, using their respective selection transistors, both the selection routes along the first direction and the selection routes along the second direction allow the memory cells within the memory array area to be addressed.

* * * * *